United States Patent [19]

Ibuka et al.

[11] Patent Number: 5,284,798
[45] Date of Patent: Feb. 8, 1994

[54] METHOD FOR FORMING AN ELECTRODE FOR A COMPOUND SEMICONDUCTOR

[75] Inventors: Toshihiko Ibuka; Masahiro Noguchi, both of Ushiku, Japan

[73] Assignees: Mitsubishi Kasei Polytec Co.; Mitsubishi Kasei Corporation, Tokyo, Japan

[21] Appl. No.: 966,535

[22] Filed: Oct. 26, 1992

Related U.S. Application Data

[62] Division of Ser. No. 573,756, Aug. 28, 1990, Pat. No. 5,192,994.

[30] Foreign Application Priority Data

Aug. 30, 1989 [JP] Japan .................... 1-225903

[51] Int. Cl.$^5$ .............. H01L 21/441; H01L 21/324
[52] U.S. Cl. ......................... 437/184; 437/197; 437/202; 437/247
[58] Field of Search ............. 437/184, 202, 196, 197, 437/247

[56] References Cited

U.S. PATENT DOCUMENTS 4,927,782 5/1990 Davey et al. .................. 437/184

FOREIGN PATENT DOCUMENTS 94873 8/1978 Japan ....................... 437/184

OTHER PUBLICATIONS

"Contact Resistances of Au-Ge-Ni, Au-Zn and Al to III-V Compounds"—Shih et al, Solid State Electronics, 1972, vol. 15, pp. 1177-1180.

Primary Examiner—John S. Maples
Attorney, Agent, or Firm—Armstrong, Westerman, Hattori, McLeland & Naughton

[57] ABSTRACT

On the surface of n-type layer of $Ga_{1-x}Al_xAs$ ($0 \leq X \leq 1$) having n-type layer, Au layer is formed as a first layer, and alloying treatment is performed after Ge layer, Ni layer and Au layer are sequentially formed. The first Au layer, the second Ge layer, the third Ni layer and the fourth Au layer have the following thickness:

| 1st layer | Au | 10–100 Å |
|---|---|---|
| 2nd layer | Ge | 50–200 Å |
| 3rd layer | Ni | 50–200 Å |
| 4th layer | Au | 200–1000 Å |

Thus, it is possible to form an ohmic electrode, which has low contact resistance and does not develop ball-up phenomenon.

14 Claims, 4 Drawing Sheets

METHOD FOR FORMING AN ELECTRODE FOR A COMPOUND SEMICONDUCTOR

This is a division of application Ser. No. 07/573,756 filed Aug. 28, 1990 now U.S. Pat. No. 5,192,994.

FIELD OF THE INVENTION

The present invention is directed a method to for forming an electrode for a compound semiconductor.

BACKGROUND OF THE INVENTION

In the conventional method for forming an ohmic electrode of a compound semiconductor such as an n-type GaAs, GaAlAs, etc., in order to form the product in a desirable form on the semiconductor substrate, a photo resist pattern is formed on the n-type layer surface in many cases, and vacuum evaporation is performed by a resistance heating method with an alloy of Au and Ge as a vacuum evaporation source, and Ni is vacuum-deposited by a resistance heating method or by an electron beam deposition method. Namely, as shown in FIG. 3, the pattern 3 is formed (FIG. 3 (b)) using a photo resist on n-GaAlAs 2 formed on p-GaAlAs 1. Then, the electrode materials Au/Ge layer 4 and a Ni layer 5 are vacuum-deposited on the entire surface (FIG. 3 (c)), unnecessary portions are removed by a lift-off method, and the electrode pattern 6 is formed as shown in FIG. 3 (d). In order to obtain an ohmic property after electrode materials are vacuum-deposited, alloying treatment is performed by heating at 400° to 500° C. in a nitrogen or hydrogen atmosphere.

A composition profile to a depth from the electrode surface was obtained on such a conventional type Au-Ge/Ni electrode using SIMS (secondary ion mass spectrometry), the results being shown in FIG. 4. In the figure, the abscissa represents the depth from the electrode surface (in any unit), and the ordinate is the component strength (in any unit).

In the figure, the depth with equal strength of Au and Ga approximately corresponds to the interface between the electrode and semiconductor, and the Ni content at this position in as high as 2.38 wt %. Natural oxide film is present on the AlGaAs surface, and Au-Ge solution are aggregated on the portion without an oxide film, developing the irregular alloying, the so-called ball-up phenomenon. Because Ni shows strong solid phase reaction with GaAs, a part of the Ni is diffused to the AlGaAs interface. Thus, GaAs is decomposed in solid phase, and the compounds such as NiAs, $\beta$-AuGa, etc. are formed. By this solid phase reaction, a natural oxide film on the AlGaAs semiconductor surface is removed, and this prevents ball-up phenomenon. In an Au-Ge/Ni electrode by the conventional method, Ni is diffused in large quantity to the AlGaAs layer as is evident from FIG. 4, to prevent ball-up, such that it is necessary to vacuum-deposit Ni in a large quantity. Also, Al is piled up on the electrode layer surface. Because Al is easily oxidized and is turned to insulating material when oxidized, contact resistance is increased, and the ohmic property is lost in some cases.

In the conventional method, when the mixed crystal ratio x of Al in an n-type $Ga_{1-x}Al_xAs$ ($0 \leq \times 1$) or an n-type $Ga_{1-x}Al_xAs$ with low carrier density is 0.5 or more, contact resistance is not sufficiently low. If alloy temperature is set at higher value in order to decrease contact resistance, ball-up phenomenon occurs. Irregularities are found on the surface of vacuum-deposited metal, and detachment occurs during wire bonding.

SUMMARY OF THE INVENTION

An object of the present invention is to solve the above problems.

Another object of the present invention is to form an ohmic electrode having low contact resistance and developing no ball-up phenomenon.

With the purpose of obtaining an ohmic electrode having low contact resistance and developing no ball-up phenomenon, the present inventors have found after strenuous efforts that the above object can be attained by controlling the sequence of vacuum-deposition of Au, Ga and Ni and the thickness of vacuum-deposited film of these substances.

The object of the invention as described above can be attained as follows: In an ohmic electrode of $Ga_{1-x}Al_xAs$ ($0 \leq X \leq 1$) using au, Ge and Ni as electrode materials, (1) Ni content in the interface between electrode and semiconductor is 20 wt % or less; (2) Al component on the electrode surface is 3 wt % or less; and (3) on the n-type layer surface of a compound semiconductor having an n-type layer, Au is vacuum-deposited by 10–200 Å as a first layer, Ge is deposited by 50–200 Å as a second layer, Ni by 50–200 Å as a third layer, and Au by 200–1000 Å as a fourth layer. Then, heat treatment (alloying treatment) is performed at 350° to 500° C. in an atmosphere of inert gas such as hydrogen or nitrogen.

DESCRIPTION OF THE PREFERRED EMBODIMENT

Figure 1A:
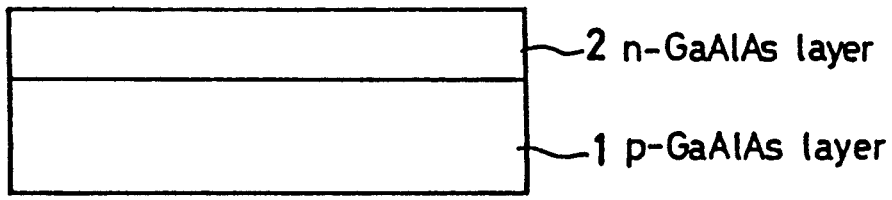
FIGS. 1a–1d are drawings to show a method to form an ohmic electrode for compound semiconductor according to the present invention.
Figure 1B:
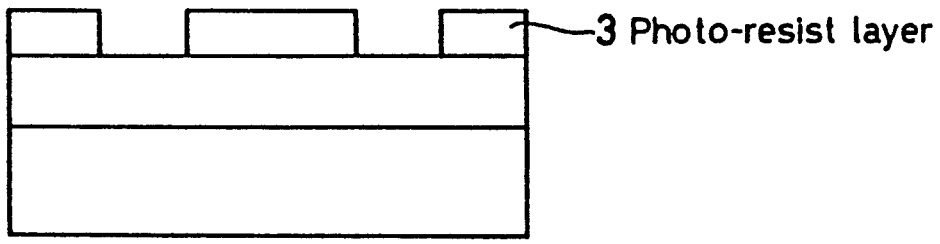
Figure 1C:
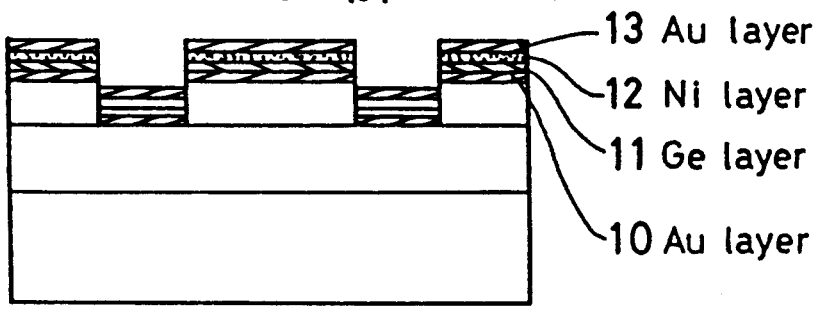
Figure 1D:
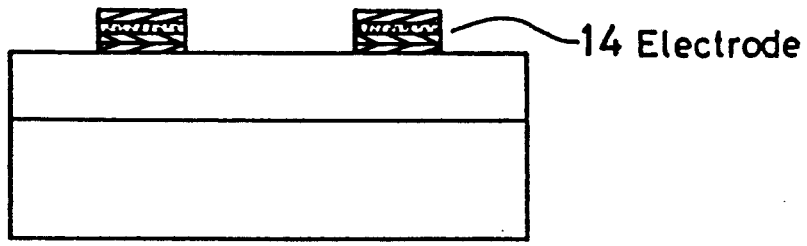

The present invention is a method to form an ohmic electrode for $Ga_{1-x}Al_xAs$ ($0 \leq X \leq 1$) compound semiconductor using Au, Ge and Ni as electrode materials, characterized in that the Ni content in the interface of electrode and semiconductor is 20 wt % or less, that the Al content on electrode surface is 3 wt % or less, and that, as shown in FIG. 1 (a) to (d), Au is vacuum-deposited by 10–200 Å as a first layer on the n-type layer surface of a compound semiconductor having an n-type layer, Ge is vacuum-deposited by 50–200 Å as a second layer, Ni by 50–200 Å as a third layer, and Au by 200–1000 Å as a fourth layer, and heat treatment (alloying treatment) is performed at 350° to 500° C. in an atmosphere of an inert gas such as hydrogen or nitrogen.

As the compound semiconductor, the method is primarily applied on $Ga_{1-x}Al_xAs$ ($0 \leq X \leq 1$). It is particularly effective when the mixed crystal ratio of Al is as high as $0.5 \leq X \leq 0.9$.

To obtain a good ohmic electrode, the sequence of vacuum deposition of Au, Ge and Ni is very important, and it is preferable that vacuum deposition is performed in the following sequence: Au in the first layer, Ge in the second layer, Ni in the third layer and Au in the fourth layer.

Next, the Au layer 10 of the first layer has preferably the thickness within the range of 10–200 Å, or more preferably, within the range of 100–150 Å. The thickness of the Ge layer 11 of the second layer is preferably within the range 50–200 Å, or more preferably within the range of the 100–150 Å. The thickness of Ni have 12 of the third layer is preferably with in the range of 50–200 Å, or more preferably within the range of 100–150 Å. The thickness of the Au layer 13 of the fourth layer is preferably within the range of 200–1000 Å, or more preferably, within the range of 300–800 Å.

The temperature during heat treatment is preferably at 350° to 500° C. If the temperature is too low, alloying is not performed to full extent. If it is too high, ball-up phenomenon occurs. As for the atmosphere during heat treatment, inert gas such $H_2$ or $N_2$ may be used, or applying partial pressure of a group V element by $AsH_3$ or the like can provide the similar effect.

The ohmic electrode having a low contact resistance and developing no ball-up phenomenon can be obtained by the above procedure. To attach the electrode materials further on compound semiconductor surface, resistance heating deposition method, electron beam deposition method, or sputtering method may be used. When wiring is performed by mounting semiconductor element to the heater of the device such as TO-18, Au wire or Al wire is normally used for wire bonding. Because the ohmic electrode is thin and may be detached during wire bonding, the pad for bonding is formed on the ohmic electrode to increase the bonding property. It is preferable to use au or Al as the pad for bonding, or Ni, Ti or Pt layer may be formed between ohmic electrode and au or Al pad for bonding. In this case, heat treatment may be performed after ohmic electrode material is deposited and the material for bonding is deposited.

Figure 2:
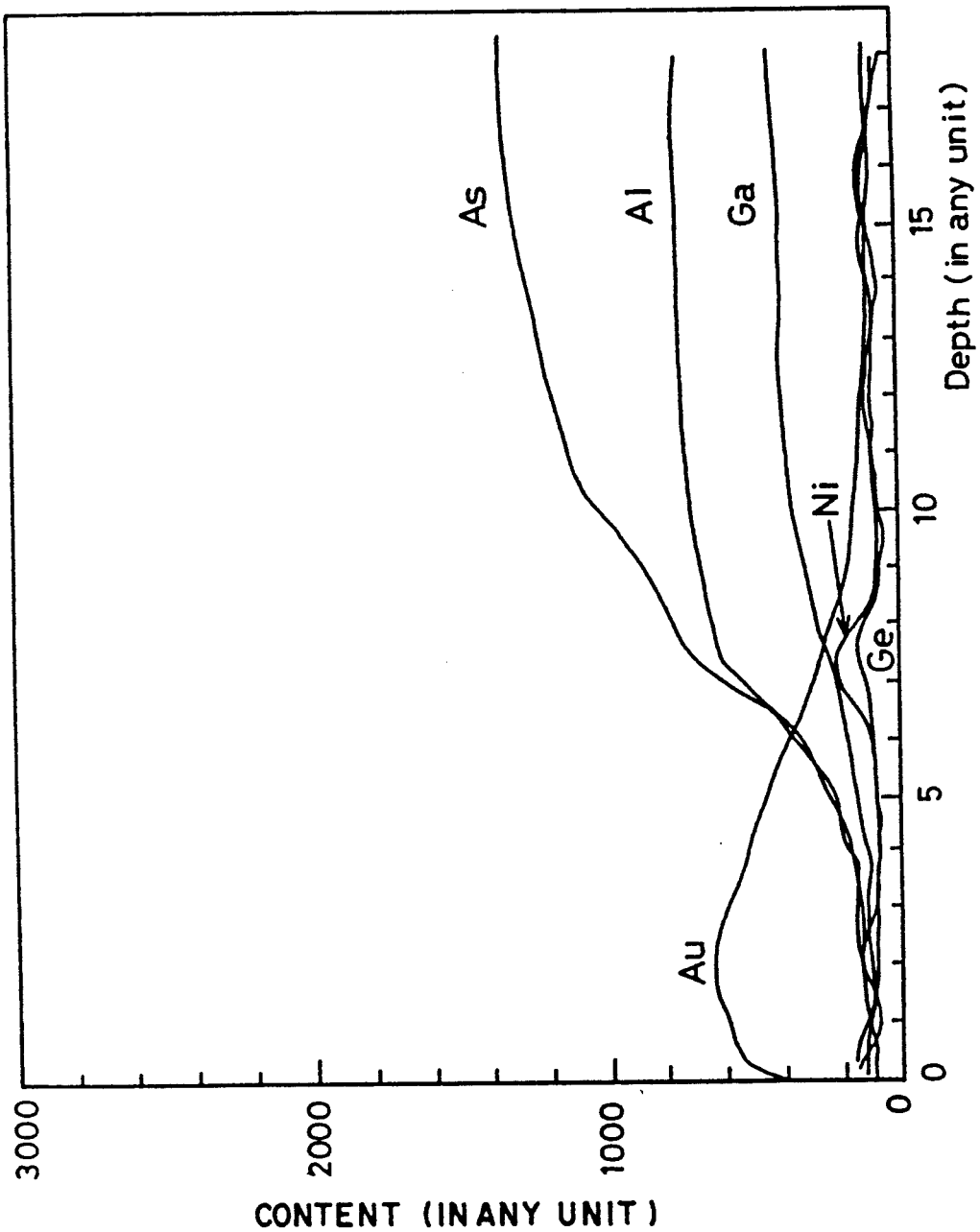
FIG. 2 is a diagram to represent composition profile to the depth from electrode surface as measured by SIMS on the electrode obtained by this invention.
Figure 3A:
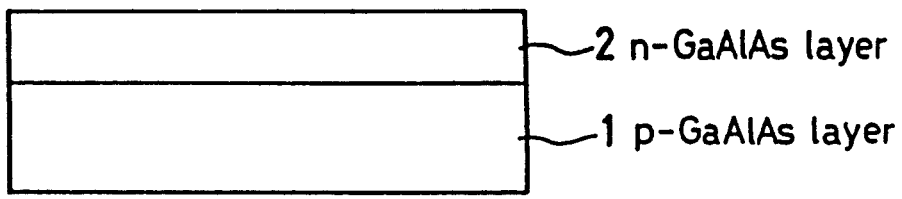
FIG. 3a–3d are to explain a conventional method to form an ohmic electrode for a compound semiconductor.
Figure 3B:
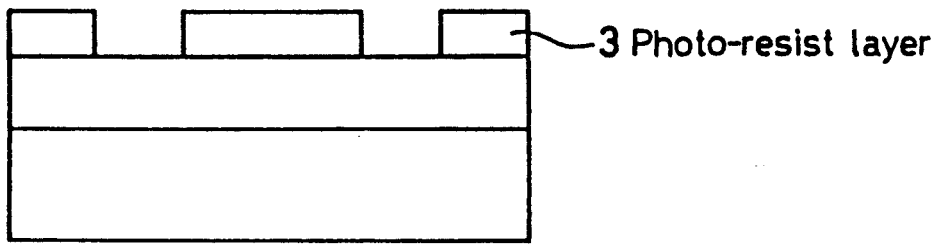
Figure 3C:
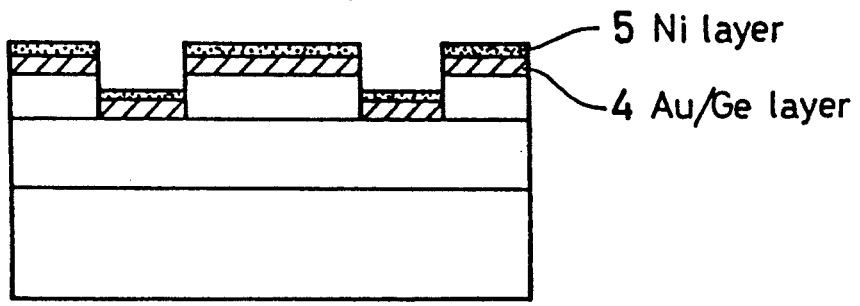
Figure 3D:
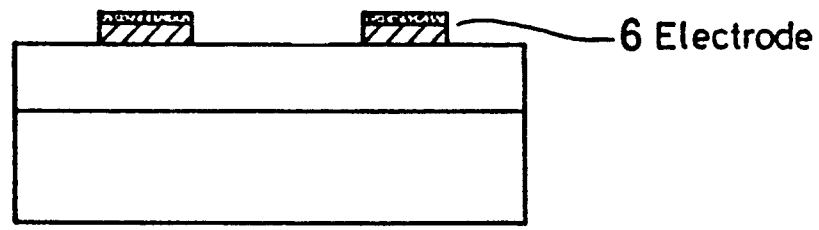
Figure 4:
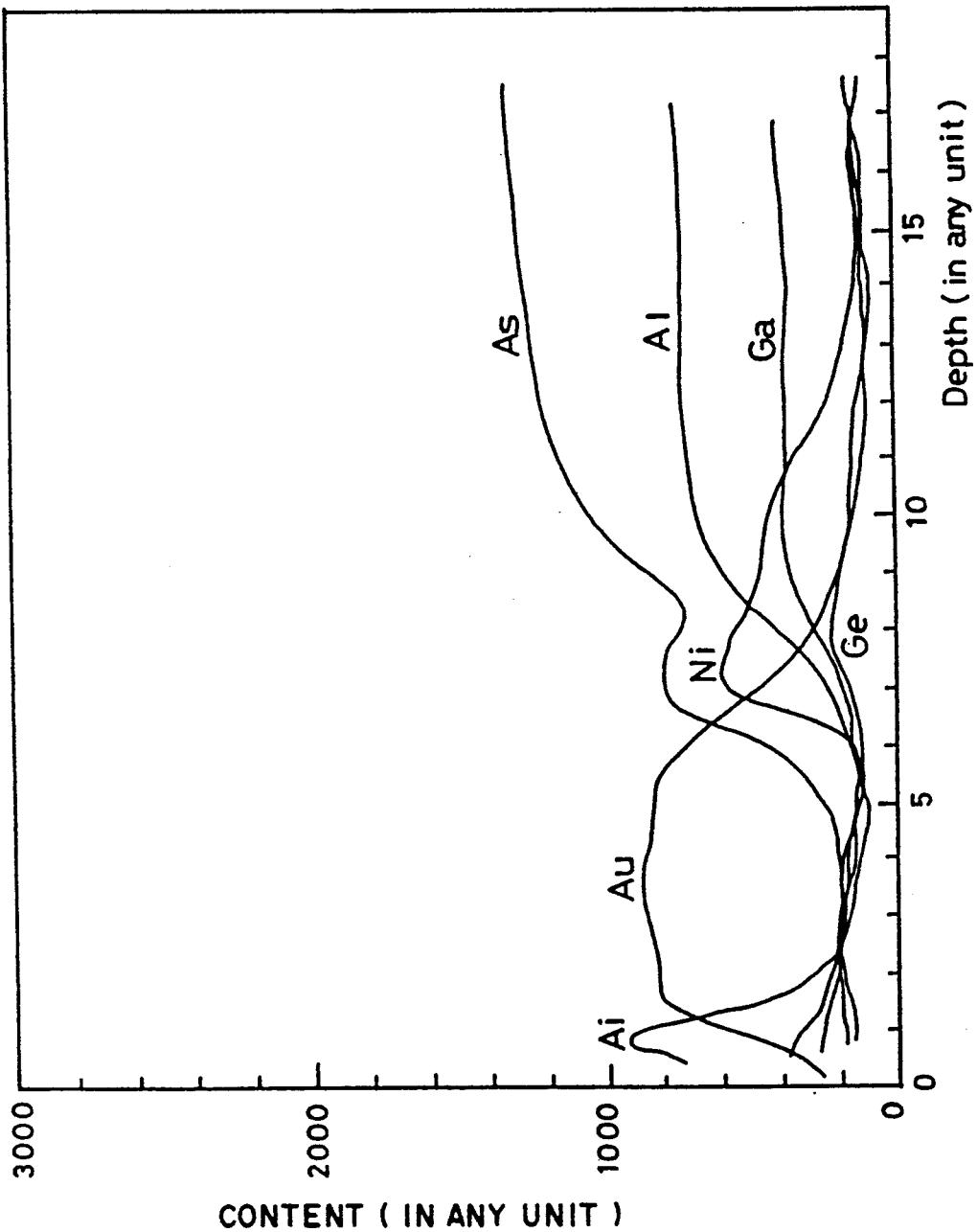
FIG. 4 is a diagram to show the composition profile to the depth from electrode surface as measured by SIMS on an electrode obtained by the conventional method.

For the electrode obtained according to this invention, the composition profile to the depth from electrode surface was obtained by SIMS as in FIG. 4. The results are shown in FIG. 2.

As it is evident from this figure, Ni has a peak value on interface between electrode and semiconductor (the position where the strength of Au is equal to that of Ga), whereas its quantity is lower than in FIG. 4. In the measured example, it was 10 wt %. Thus, it is possible by this invention to suppress the ball-up phenomenon even when the Ni content is low. Ni content on the interface is preferably 20 wt % or less. More preferably, the Ni content on the interface is 15 wt % or less. Ohmic electrode having lower Al elution to electrode surface than in FIG. 4 can be formed. The Al content on the electrode surface is preferably 3 wt % or less.

In the following, the features of the invention will be described in connection with an example and a comparative example.

EXAMPLE

Double hetero structure epitaxial crystal of p-type $Ga_{0.3}Al_{0.7}As$, p-type $Ga_{0.65}Al_{0.35}As$ and n-type $Ga_{0.3}Al_{0.7}As$ was obtained by liquid phase epitaxy method on a p-type GaAs crystal as a substrate. In this example, an epitaxial substrate was used, which has such structure that p-type GaAs crystal is removed by polishing as shown in FIG. 1(a). Mixed crystal ratio of n-type epitaxial layer was x=0.7, and carrier density was $2 \times 10^{18}$ cm$^{-3}$.

Next, a lift-off method was adopted to form an electrode of the predetermined shape on the surface of n-type $Ga_{0.3}Al_{0.7}As$. First, photo resist film 3 was coated on the entire surface, and photo resist film was then removed from only the electrode forming portion by photolithography method as shown in FIG. 1 (b). Next, as shown in FIG. 1 (c), Au layer 10 of 120 Å was vacuum-deposited as the first layer by electron beam deposition method, Ge layer 11 of 140 Å as the secondary layer, Ni layer 12 of 140 Å as the third layer, and Au layer 13 of 700 Å as the fourth layer. After depositing each of these layers, the unnecessary electrode portion was removed by lift-off method, removing photo resist film by acetone, and the electrode 14 of the shape as shown in FIG. 1 (d) was formed. Then, heat treatment was performed at 420° C. for 10 minutes in an atmosphere of $N_2$, and an electrode with smooth surface and developing no ball-up phenomenon was obtained. The contact resistance was as low as $5 \times 10^{-5}$ Ω cm$^2$, showing good ohmic property. Further, as the pad for bonding, Au of 1 μm was deposited by a resistance heating method on the above ohmic electrode. After heat treatment was performed at 350° C. for 5 minutes in an atmosphere of $N_2$, Au wire was provided by wire bonding. A good bonding property without detachment was obtained.

COMPARATIVE EXAMPLE

Using the same epitaxial substrate as used in the above example, an electrode was formed by the method to deposit Au/Ge alloy and Ni as conventionally performed. The weight ratio of AuGe alloy was: Au 88% and Ge 12%.

After Au/Ge alloy of the above composition with a thickness of 2000 Å was deposited by resistances heating method, Ni of 200 Å was deposited by an electron beam deposition method. Next, heat treatment was performed at 380° C. for 15 minutes in an atmospheres of $N_2$. Although ball-up did not occur, contact resistance was as high as $2 \times 10^{-3}$ Ω cm$^2$. Then, heat treatment was performed at 430° C. for 15 minutes. Contact resistance decreased to $7 \times 10^{-4}$ Ω cm$^2$. But ball-up phenomenon occurred, and extreme irregularities were formed on the electrode surface.

As described above, it is possible according to the present invention to obtain ohmic electrode on the surface of n-type $Ga_{1-x}Al_2As$, having good reproducibility, low contact resistance, smooth electrode surface and causing no detachment during wire bonding. Thus, the invention provides enormous effect as the method to form an electrode for $Ga_{1-x}Al_xAs$, which is to be used for optical device or ultra-high speed electronic device such as high luminance light-emitting diode, semiconductor laser, etc.

What we claim is:

1. A method of forming an ohmic electrode comprising:
    providing a $Ga_{1-x}Al_xAs$ (0 ≦ X ≦ 1) compound semiconductor having an n-type layer and a p-type layer;
    forming a Au layer as a first layer on said n-type layer of said compound semiconductor;
    forming a Ge layer as a second layer on said first layer;

forming a Ni layer as a third layer on said second layer;

forming a Au layer as a fourth layer on said third layer; and alloying said first, second, third and fourth layers by heat treatment.

2. The method of claim 1, wherein said first layer is formed with a thickness of about 10 to 200 Å, said second layer is formed with a thickness of about 50 to 200 Å, said third layer is formed with a thickness of about 50 to 200 Å, and said fourth layer is formed with a thickness of about 200 to 1000 Å.

3. The method of claim 2, wherein said first, second and third layers are each formed with thicknesses of about 100 to 150 Å, and said fourth layer is formed with a thickness of about 300 to 800 Å.

4. The method of claim 1, wherein said alloying is performed at a temperature of about 350° to 500° C.

5. The method of claim 4, wherein said alloying is performed in an atmosphere of inert gas.

6. The method of claim 1, wherein prior to forming said first layer, a photo resist film is coated on said n-type layer of said compound semiconductor, and after forming said fourth layer, said photo resist film is removed by a solvent.

7. The method of claim 3, wherein said first layer is formed at a thickness of about 120 Å, said second and third layers are each formed at thicknesses of about 140 Å, and said fourth layer is formed at a thickness of about 700 Å, and said alloying is performed at a temperature of about 420° C. for about 10 minutes in an atmosphere of $N_2$.

8. The method of claim 1, wherein said compound semiconductor comprises a double hetero structure epitaxial crystal of p-type $Ga_{0.3}Al_{0.7}As$, p-type $Ga_{0.66}Al_{0.35}As$ and n-type $Ga_{0.3}Al_{0.7}As$ on a p-type GaAs crystal substrate.

9. The method of claim 8, wherein the mixed crystal ratio of said n-type epitaxial layer is $x=0.7$ and has a carrier density of $2 \times 10^{18}$ cm$^{-3}$.

10. The method of claim 1, wherein said plurality of forming steps comprise at least one of resistance heating deposition, electron beam deposition and sputtering.

11. The method of claim 1, further comprising forming a pad for wire bonding comprising at least one of Au and Al.

12. The method of claim 11, further comprising forming a layer comprising at least one of Ni, Ti and Pt between the ohmic electrode and said pad for wire bonding.

13. The method of claim 1, wherein the step of alloying the first, second, third and fourth layers by heat treatment results in an electrode material having a first die at an interface between the ohmic electrode and the compound semiconductor and having a second side defining an outer surface of the ohmic electrode, wherein the electrode material has a Ni content at the first side thereof at the interface between the ohmic electrode and the compound semiconductor of 20 wt % or less.

14. The method of claim 13, wherein the alloying of the first, second, third and fourth layers by heat treatment results in the electrode material having an Al component on the second side of the electrode material at the outer surface of the ohmic electrode of 3 wt % or less.

* * * * *